United States Patent [19]

Tang

[11] Patent Number: 5,198,387
[45] Date of Patent: Mar. 30, 1993

[54] METHOD AND APPARATUS FOR IN-SITU DOPING OF DEPOSITED SILICON

[75] Inventor: Thomas E. Tang, Dallas, Tex.

[73] Assignee: Texas Instruments Incorporated, Dallas, Tex.

[21] Appl. No.: 742,715

[22] Filed: Aug. 5, 1991

Related U.S. Application Data

[63] Continuation of Ser. No. 444,900, Dec. 1, 1989, abandoned.

[51] Int. Cl.$^5$ .............................................. H01L 21/20
[52] U.S. Cl. .................................... 437/101; 437/109; 437/233; 437/165
[58] Field of Search ............... 437/165, 233, 240, 101, 437/109; 148/DIG. 122, DIG. 1, DIG. 110

[56] References Cited

U.S. PATENT DOCUMENTS

| | | | |
|---|---|---|---|
| 3,660,179 | 5/1972 | Desmond et al. | 437/240 |
| 4,007,074 | 2/1977 | Ogirima et al. | 437/165 |
| 4,151,058 | 4/1979 | Kaplan et al. | 437/109 |
| 4,217,375 | 8/1980 | Adams . | |
| 4,229,502 | 10/1980 | Wu et al. . | |
| 4,357,179 | 11/1982 | Adams et al. . | |
| 4,411,734 | 10/1983 | Maa | 437/228 |
| 4,460,416 | 7/1984 | Wonosowicz . | |
| 4,485,128 | 11/1984 | Daral et al. . | |
| 4,556,584 | 12/1985 | Sarkozy | 437/233 |
| 4,708,884 | 11/1987 | Chandross et al. . | |
| 4,721,683 | 1/1988 | Ward . | |
| 4,793,283 | 12/1988 | Sarkozy | 118/715 |
| 4,835,005 | 5/1989 | Hirooka et al. | 437/225 |
| 4,844,006 | 7/1989 | Page, Jr. et al. | 118/715 |
| 4,874,716 | 10/1989 | Rao | 437/101 |
| 4,877,753 | 10/1989 | Freeman . | |
| 4,882,299 | 11/1989 | Freeman et al. | 437/233 |
| 5,096,856 | 3/1992 | Freeman | 437/959 |

FOREIGN PATENT DOCUMENTS

| | | | |
|---|---|---|---|
| 0016331 | 5/1971 | Japan | 437/165 |
| 0079459 | 7/1978 | Japan | 437/165 |
| 0147783 | 11/1979 | Japan | 437/165 |
| 56-112720 | 5/1981 | Japan . | |
| 57-180175 | 6/1982 | Japan . | |
| 0109221 | 6/1985 | Japan | 437/101 |
| 62-151564 | 7/1987 | Japan | 118/715 |
| 0166540 | 6/1989 | Japan . | |
| 2199987 | 7/1988 | United Kingdom | 437/101 |

OTHER PUBLICATIONS

Deposit and electrical . . . by LPCVD; Learn et al., (AIP) J. Appl. Phys. Mar. 1987, pp. 1898-1904.
Formation of Poly-Si electrodes into deep trenchs . . . , Sawada et al. (Japan, 1989) pp. 41-42.

(List continued on next page.)

*Primary Examiner*—Brian E. Hearn
*Assistant Examiner*—Michael Trinh
*Attorney, Agent, or Firm*—Gary C. Honeycutt; Richard L. Donaldson; William E. Hiller

[57] ABSTRACT

A method and apparatus for deposition of an in-situ doped silicon film are disclosed. The deposition may be carried out in an LPCVD reactor, with the temperature of the chamber during deposition preferably closely above the decomposition temperature of silane gas. The preferred dopant source is tertiary butyl phosphine, since the deposition rate of in-situ doped silicon using this source is much greater than that using phosphine as the source, which allows low temperature deposition at reasonable rates. At a temperature of about 560° Celsius, the phosphorous is better incorporated into the deposited film than in films deposited at higher temperatures, which allows the ratio of dopant gas to silane in the chamber to be lower; a low dopant ratio allows improved deposition thickness uniformity. The LPCVD reactor preferably has an injector tube therein which travels a distance within the reactor before its opening, through which the tertiary butyl phosphine passes. This allows the tertiary butyl phosphine to be fully heated, and therefore fully decomposed, prior to its introduction into the chamber. Such full decomposition of the dopant source gas further improves the uniformity of the thickness of the deposited film.

8 Claims, 7 Drawing Sheets

OTHER PUBLICATIONS

Pyrolysis of TBP, Larsen et al., vol. 18, No. 3 (AIME 1989) pp. 457–464.

Phosphorous-doped PolySi via LPCND; Electro Chem. Soc. vol. 131 No. 10 (84), pp. 2361–2368.

Silicon Processing for the VLSI, Wolf et al. 1986, pp. 169–182, vol. 1; 264–266 VLSI Fabrication Principles; Sorab Ghandhi; Apr. 1984, pp. 160–162.

Sawada et al., "Formation of Polysilicon Electrodes in Deep Trenches with Two-Step Continuous Deposition of In-Situ Doped and Undoped Polysilicon Firms," *Symposium on VLSI Technology* (Japan, 1989), pp. 41–42.

Li et al., "Pyrolysis of Tertiarybutylphosphine," *J. of Electronic Materials*, vol. 18, No. 3 (AIME, 1989) pp. 457–464.

Learn et al., "Deposition and Electrical Properties of in-situ Phosphorous Doped Silicon Firms Formed by Low Pressure Chemical Vapor Deposition," *J. Appl. Phys.* 61(5); (American Inst. of Phys.); pp. 1898–1904; Mar. 1987.

Meyerson et al., "Phosphorous-Doped Polycrystalline Silicon Via LPCVD" *J. Electrochem. Soc.* vol. 131, No. 10 (1984), pp. 2361–2368.

Roenigk et al., "Analysis of Multicomponent LPCVD Processes," *J. Electrochem. Soc.*, vol. 132, No. 2 (Feb. 1985), pp. 448–454.

METHOD AND APPARATUS FOR IN-SITU DOPING OF DEPOSITED SILICON

This application is a continuation of application Ser. No. 07/444,900, filed Dec. 1, 1989, now abandoned.

This invention is in the field of integrated circuits, and is more specifically directed to the deposition of doped semiconductor material.

BACKGROUND OF THE INVENTION

In the field of semiconductor integrated circuits, particularly where silicon is the primary semiconductor, the use of non-monocrystalline silicon has become widespread. For example, doped polycrystalline silicon is widely used as a gate material for metal-oxide-semiconductor (MOS) transistors, as its work function facilitates the fabrication of high performance enhancement mode transistors. In addition, the conductivity of doped polycrystalline silicon is sufficiently high that it can be used as interconnection material in integrated circuits.

Polycrystalline silicon (commonly referred to as polysilicon) film is generally formed by chemical vapor deposition, usually by the decomposition of silane ($SiH_4$) gas at low pressure. A conventional method of forming a film of doped polysilicon is to deposit an undoped polysilicon film, and then dope the deposited film by diffusion or ion implantation. A common method of n-type diffusion doping is the decomposition of $POCl_3$ in a CVD reactor, so that phosphorous is deposited over the undoped polysilicon film, followed by a high temperature anneal (commonly performed at 850° C. or 900° C., for twenty to thirty minutes) to diffuse the deposited phosphorous into the film. The polysilicon film can also be doped by ion implantation of boron (for p-type), or arsenic or phosphorous (for n-type), also followed by a high temperature anneal to diffuse the implanted dopant into the film.

The above-described method of depositing undoped polysilicon and thereafter doping the film has been widely used in the industry. This method not only requires the additional steps of deposition or ion implantation, and in both cases a high temperature anneal, but also is not readily compatible with the processing requirements of many modern integrated circuits. For example, the use of silicide-clad junctions has become more common in recent years. An example of a method for the direct reaction of a refractory metal with silicon to form a silicide-clad junction is described in U.S. Pat. No. 4,545,116 issued Oct. 8, 1985, assigned to Texas Instruments Incorporated, and incorporated herein by this reference. Once the silicide is in place over a doped region of the substrate, however, the temperature to which the structure is subsequently subjected, as well as the time spent at such a temperature, must be limited, as the high temperature can cause remaining atoms of the refractory metal to react with the underlying silicon. In modern integrated circuits where the junction depth is required to be quite shallow (e.g., below 0.2 micron), such additional high temperature exposure could cause the doped region to be totally consumed by the silicide at a location, shorting out the junction. In some structures, for example a BiCMOS structure having a doped polysilicon emitter electrode, a doped polysilicon film may be formed after the silicide cladding of the MOS source/drain junctions. In such a structure, the method of subsequently doping an undoped polysilicon film may not be desirable.

A second technique known in the industry for forming a doped polysilicon film is commonly referred to as in-situ doping. This is accomplished by the introduction of dopant gas during the chemical vapor deposition of the polysilicon, so that the resultant polysilicon film contains dopant throughout, without requiring subsequent doping and annealing steps. For n-type dopant, a common dopant gas is phosphine ($PH_3$); the phosphine is conventionally mixed with the silane gas prior to its introduction into the CVD reactor. However, the use of phosphine as the source gas provides multiple problems. Phosphine gas is quite toxic, and accordingly thorough handling precautions and equipment are required for its use. In addition, phosphine can "poison" the surface of the wafer upon which the deposition is taking place, which not only slows the deposition rate, but also results in non-uniform polysilicon film thickness over the surface of the wafer, and also from wafer to wafer when deposition occurs in a multiple-wafer chamber. Such problems are described by B. Meyerson et al., in "Phosphorous-Doped Polysilicon via LPCVD", J. Electrochem. Soc. 129, 1984, p. 2361. While the uniformity problems may be addressed by specially designing the LPCVD furnaces, using caged boats and wider wafer spacing (see A. Learn et al., "Deposition and Electrical Properties of In-situ Phosphorous Doped Silicon Films Formed by LPCVD," J. Appl. Phys. 61(5), p. 1898, 1987), such equipment-based solutions can introduce particle contaminants, and are incompatible with higher-level automation and with mass production high volume wafer fabrication factories.

In addition, many integrated circuits are now using polysilicon to fill trenches etched into the substrate. Such filled trenches can be used for isolation purposes, as described in U.S. Pat. No. 4,631,803, issued Dec. 30, 1986, and in U.S. Pat. No. 4,835,115, issued May 30, 1989, both assigned to Texas Instruments Incorporated and incorporated herein by this reference, or for purposes of making connection to underlying layers in the substrate, as described in copending application Ser. No. 178,728, filed Apr. 7, 1988, assigned to Texas Instruments Incorporated and also incorporated herein by this reference. Another important use of a polysilicon filled trench is a memory cell in a dynamic random access memory (dRAM), where a storage capacitor is formed in a trench etched into the substrate. In the example of a dRAM, the storage capacitor is formed having opposing plates of the sides of the trench and a doped polysilicon plug filling the trench, and separated from the walls of the trench by a thin dielectric. Examples of trench capacitor dRAM cells are shown in copending application Ser. No. 385,340, Ser. No. 385,341, Ser. No. 385,601, and Ser. No. 385,328, all filed Jul. 25, 1989, all assigned to Texas Instruments Incorporated, and all incorporated herein by this reference. In addition, devices having vertical transistors can utilize polysilicon gate electrodes disposed within a trench. Examples of such a device, not only having a vertical transistor but also having having the storage capacitor disposed within a trench, and accordingly utilizing multiple polysilicon plugs within the trench, are described in U.S. Pat. No. 4,830,978, issued May 16, 1989, assigned to Texas Instruments Incorporated, and incorporated herein by this reference.

Due to the depth of the trenches in these structures, and accordingly the depth of the doped polysilicon plug, the method of depositing an undoped polysilicon film and subsequently doping it (either by diffusion or ion implantation) has limited use in the application of polysilicon-filled trenches. Accordingly, in-situ doping of the polysilicon plugs is much preferred for these applications. In order to successfully fill the trench with deposited polysilicon, however, the deposited film must have a high degree of conformality over the surface of the wafer, and into the trench When phosphine has been used as the in-situ dopant for a polysilicon plug, it has been observed that the conformality is poor (see K. Sawada et al., "Formation of Polysilicon Electrodes in Deep Trenches with Two-step Continuous Deposition of In-situ Doped and Undoped Polysilicon Films", Symposium on VLSI Technology (1989), p. 41). As modern high density dRAMs, such as 16 Mbit dRAMs, may include high-aspect ratio trenches (e.g., 12 microns deep and 1 micron across), conformal in-situ doped polysilicon is a stringent requirement.

U.S. Pat. No. 4,877,753, issued Oct. 31, 1989, assigned to Texas Instruments Incorporated, and incorporated herein by this reference, describes a method for in-situ doping a polysilicon film using phosphorous sources other than gaseous phosphine, including tertiary butyl phosphine. As described in this patent, these dopant sources provide the advantage of lower toxicity, as compared with phosphine gas, as well as provide films with improved thickness uniformity and lower sheet resistance.

It is an object of this invention to provide a method of forming in-situ doped silicon films with further improvements in thickness uniformity, while providing a film with low sheet resistance at a reasonable deposition rate.

It is a further object of this invention to provide such a method which has improved conformality, and is therefore especially advantageous in forming silicon plugs for trenches.

It is a further object of this invention to provide such a method which can be done at relatively low temperatures while still maintaining good uniformity and sheet resistance values, at a reasonable deposition rate, in such a manner as to be compatible with modern high-density fabrication processes.

It is a further object of this invention to provide an apparatus which is especially adapted to depositing an in-situ doped silicon film with the above properties.

Other objects and advantages of this invention will be apparent to those of ordinary skill in the art having reference to this specification together with the drawings.

SUMMARY OF THE INVENTION

The invention may be practiced in a method for depositing a silicon film with in-situ doping The dopant source is a liquid vapor source of an organophosphorous or organoarsenic compound, such as tertiary butyl phosphine, and is introduced into a CVD reactor together with the source gas for silicon, for example silane. The temperature of deposition is kept relatively low, preferably just above the temperature at which the dopant source compound substantially completely decomposes (e.g., above 550° C. for tertiary butyl phosphine). The low deposition temperature allows for improved dopant incorporation into the deposited film, which in turn allows the ratio of dopant gas to silane to be low. This low ratio of dopant gas to silane improves the uniformity and conformality of the deposition, while providing a film with low sheet resistance, deposited at a good deposition rate. The silicon is substantially amorphous when deposited. Subsequent annealing of the deposited film can be relatively short and at relatively low temperatures, to activate the dopant and thereby reduce the sheet resistance. The preferred apparatus heats the dopant source gas prior to its distribution into the chamber, to ensure that the dopant source gas is fully decomposed prior to exposure of the wafer thereto.

DETAILED DESCRIPTION OF THE PREFERRED EMBODIMENTS

Figure 1A:
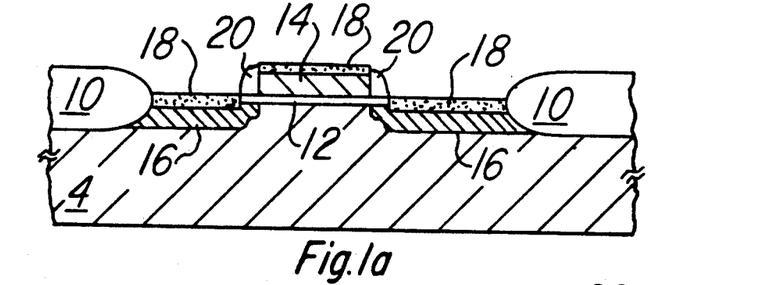
FIGS. 1a through 1c are cross-sectional diagrams of a partially fabricated wafer illustrating the results of process steps according to the invention.
Figure 1B:
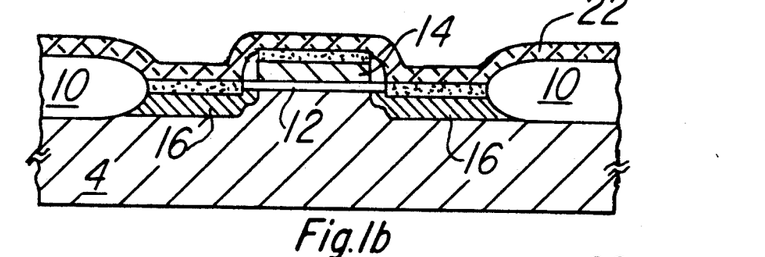
Figure 1C:
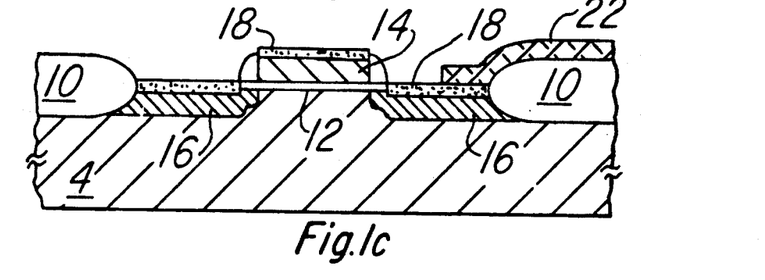

Referring to FIGS. 1a through 1c, a preferred embodiment of the invention will now be described. This embodiment will be described relative to the formation of a second polysilicon layer over a previously formed MOS transistor with self-aligned silicide cladding on the source, drain and gate of the transistor, as the instant invention is especially advantageous in such an application. However, it should be noted that any deposition of silicon by chemical vapor deposition, including such simple cases as the formation of the polysilicon gate of a self-aligned silicon gate transistor, can utilize the benefits of the invention. As discussed above, the invention is particularly advantageous for the formation of a doped polysilicon layer after other elements such as doped source/drain regions have been formed, especially if the source/drain regions have been clad with a refractory metal silicide, as is the case for the structure of FIG. 1a.

FIG. 1a illustrates, in cross-section, a partially fabricated semiconductor structure formed at a surface of a semiconductor wafer having a single-crystal silicon substrate 4, which in this case is relatively lightly p-type doped. Field oxide regions 10 are formed at the surface according to the well-known local oxidation of silicon (LOCOS) technique, or other improved or other isolation techniques such as the poly-buffered LOCOS isolation method described in U.S. Pat. No. 4,541,167 issued Sep. 17, 1985, assigned to Texas Instruments Incorporated and incorporated herein by this reference. A conventional lightly-doped drain silicon-gate, self-aligned MOS transistor is shown in FIG. 1a, having n+ source/drain regions 16, gate dielectric 12, and polysilicon gate electrode 14. Each of source/drain regions 16 and gate electrode 14 are shown as clad with a refractory metal silicide film 18, an example of which is titanium silicide. The above-noted U.S. Pat. No. 4,545,116 describes a method for forming titanium silicide by way of direct reaction in nitrogen atmosphere. As described in U.S. Pat. No. 4,384,301, issued May 17, 1983, assigned to Texas Instruments Incorporated and incorporated herein by this reference, sidewall filaments 20, preferably of an insulating material such as silicon dioxide, allow self-aligned silicidation by the direct reaction in such a manner that the silicide film 18 over source/drain regions 16 does not short to silicide film 18 cladding gate electrode 14. As described in U.S. Pat. No. 4,356,623, issued Jul. 25, 1989, assigned to Texas Instruments Incorporated and incorporated herein by this reference, sidewall filaments 20 can also be used in the construction of source/drain regions 16 so as to form a graded junction.

Referring now to FIG. 1b, the structure of FIG. 1a is illustrated after the deposition of a second polysilicon layer 22, doped in-situ with its deposition according to this embodiment of the instant invention. In this embodiment, the wafer is placed within a low pressure chemical vapor deposition (LPCVD) reactor; the LPCVD reactor can either be of batch or single-wafer type. However, for the dopant source used according to this embodiment, modifications to a conventional LPCVD batch reactor are preferred in order to provide improved uniformity of deposition both across a single wafer, and from wafer-to-wafer within the batch. A preferred reactor will be described in further detail hereinbelow.

According to this embodiment, silane ($SiH_4$) gas and a dopant gas are introduced into the LPCVD reactor, and the deposition of in-situ doped silicon over the surface of the wafer will proceed. The preferred dopant gas in this embodiment, where n-type doped silicon is deposited, is $(CH_3)_3CPH_2$, commonly referred to as tertiary butyl phosphine, or TBP. As described in said U.S. Pat. No. 4,877,753, the use of TBP, or other liquid vapor dopant sources, such as organophosphorous compounds including isobutyl phosphine, trimethyl phosphate, and tetramethyl phosphate, provide the advantage of reduced toxicity relative to phosphine gas, especially when stored and handled outside the LPCVD chamber. For other dopant species such as arsenic, liquid vapor dopant sources including organoarsenic compounds have reduced toxicity relative to arsine gas. An example of such a compound includes tributyl arsine. Other examples of organophosphorous compounds and organoarsenic compounds are described in U.S. Pat. No. 4,721,683, issued Jan. 26, 1983 and incorporated herein by this reference.

In this embodiment, the process pressure is preferably less than one Torr, for example in a range from 100 to 500 mTorr. The process temperature for the deposition is preferably at least above the temperature at which the dopant source compound will substantially completely decompose. For the example of TBP as the dopant source, the 100% decomposition temperature is approximately 550° C. However, it is preferable that the temperature remain relatively close to the 100% decomposition temperature of the dopant compund, for example between 550° C. and 600° C. for TBP. As will be described hereinbelow, based on comparative data using TBP as the dopant source compound, the preferred deposition temperature is about 560° C., and the preferred process pressure is approximately 250 mTorr.

Figure 2:
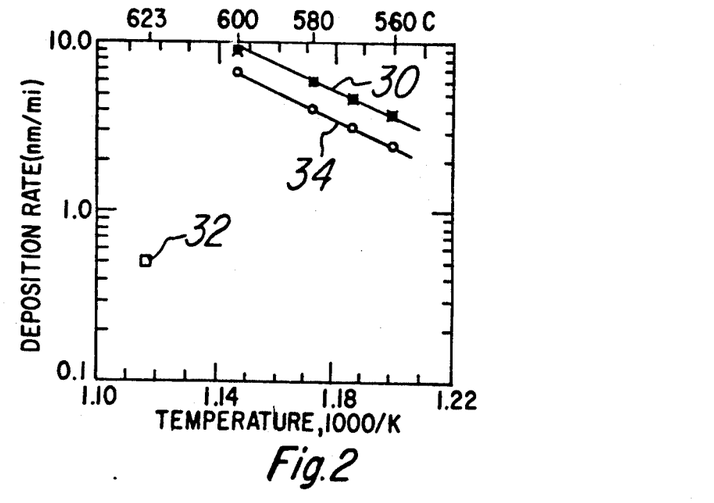
FIG. 2 is a plot of deposition rate versus temperature for silicon with varying dopant sources.

In addition to reduced toxicity, the use of dopant sources such as TBP also provide advantages in the fabrication of integrated circuits. Referring to FIG. 2, the deposition rate of silicon versus temperature is plotted for various dopants. It is known that the presence of dopant reduces the deposition rate of CVD silicon. This reduction is believed to be due to "poisoning", by the dopant, of the surface upon which deposition is taking place. This poisoning occurs from the reaction of the dopant species, for example phosphorous, with the underlying semiconductor or insulating material in such a manner that deposition is inhibited thereat. Another effect of dopant upon the deposition of silicon is referred to as "site competition", where the dopant species attaches to a nucleation site on the surface to which a silicon atom would otherwise attach. The reduction of the number of nucleation sites for silicon atoms will, of course, reduce the deposition rate of the silicon film.

The effect on the deposition rate of in-situ dopant depends strongly on the source compound. Curve 30 in FIG. 2 illustrates the deposition rate of undoped silicon versus temperature, while point 32 illustrates the deposition rate of silicon reported by Meyerson et al. (cited hereinabove) where the dopant source is phosphine. Curve 34 illustrates the deposition rate versus temperature according to the invention, at a process pressure of 125 mTorr, where the dopant source is TBP, and using an batch LPCVD reactor modified as described hereinbelow.

As illustrated in FIG. 2, the use of TBP as the dopant source degrades the deposition rate by about 45% for the same conditions, while the use of phosphine as the source degrades the deposition rate by a factor of 25. It should also be noted that the activation energies for the deposition of undoped silicon and in-situ doped silicon with TBP as the source are approximately the same (1.5 eV and 1.4 eV, respectively), while the activation energy of silicon deposition where phosphine is the source has been reported as on the order of 2.0 eV. It is believed that the difference in activation energies, as well as the difference in deposition rate, indicates that less surface poisoning and site competition occurs when TBP is used as the dopant source, relative to phosphine. It should also be noted from FIG. 2 that, considering the 2.0 eV activation energy where phosphine is the dopant source, low temperature deposition of silicon where phosphine is the dopant source will not provide a useful deposition rate (i.e., the rate will be well below 0.1 nm/minute at 560° C.), while the deposition of silicon with TBP as the dopant source has a reasonable deposition rate, even at 560° C.

Table 1 shows the results of experiments according to this embodiment of the invention, and using a batch LPCVD reactor modified as described hereinbelow, where in-situ phosphorous doped silicon is deposited with TBP as the dopant source, where the process temperature, pressure, and ratio of TBP to silane are varied. An anneal of 60 minutes at 700° C. is performed after deposition in each case. It should be noted that these ratios are preferably achieved using a relatively high silane flow, for example on the order of 250 sccm. This high silane flow allows a low ratio of TBP to silane, with the flow rate of the TBP still remaining in a controllable range.

TABLE 1

| TEMP °C. | PRESS mTorr | TBP/ $SiH_4$ RATIO | DEP RATE nm/ min | POST-ANNEAL RESISTIVITY mOhm-cm | THICKNESS UNIFORMITY STD DEV (%) |
|---|---|---|---|---|---|
| 560 | 125 | 0.003 | 0.72 | 2.11 | 0.7 |
| 560 | 250 | 0.003 | 2.42 | 0.95 | 0.7 |
| 560 | 250 | 0.006 | 2.21 | 0.72 | 1.0 |
| 560 | 400 | 0.003 | 3.24 | 1.21 | 1.8 |
| 580 | 250 | 0.003 | 4.12 | 1.52 | 1.2 |
| 600 | 250 | 0.003 | 6.58 | 4.21 | 0.9 |

Certain comparisons of the data in Table 1 are especially instructive. For example, a comparison of each deposition at 250 mTorr pressure, with a TBP/silane ratio of 0.003, shows that the post-anneal resistivity of the deposited film is much improved at 560° C. relative to higher deposition temperatures. It should be noted that the deposition rate at 560° C., while lower than that at higher temperatures (as expected), is still at a reasonably high rate, especially when compared against the phosphine source gas deposition rate shown in FIG. 2. The reduced resistivity of the deposited film when deposited at lower temperatures is believed due to the effect that in-situ dopant is more easily incorporated into the deposited film when deposition is performed at lower temperatures.

Besides allowing deposition at lower temperatures, it should be noted that the improved incorporation of phosphorous dopant into the film, indicated by the low resistivity values, allows a lower concentration of dopant source gas to be used in the deposition of silicon films, while still resulting in a film with a reasonable conductivity. A comparison of the second and third lines of Table 1 shows that doubling the ratio of TBP to silane in the deposition results in a reduction in deposition rate. This is believed to be due to an increase in surface poisoning and site competition which occurs with increased dopant concentration. This increase in surface poisoning and site competition with higher dopant concentrations also degrades the film thickness uniformity over the wafer surface, as the larger dopant concentration will increase the likelihood that the dopant gas will not uniformly mix with the silane in the reactor. Such incomplete mixing will result in locally high concentrations of dopant at the surface of the wafer, which will of course reduce the deposition rate at that locality.

As a result, the preferred embodiment of this invention includes the use of TBP as a phosphorous source, with the deposition occurring at a temperature close to the decomposition temperature of TBP (i.e., approximately 560° C.). This provides a reasonable deposition rate process which takes advantage of the high incorporation of dopant into the film which occurs at such low temperatures. Due to these good dopant incorporation properties, a relatively low ratio of dopant source to silane can be used, which provides improved thickness uniformity at reasonable deposition rates.

The decomposition of TBP begins at a temperature of about 375° C., with full decomposition occurring at about 550° C. However, since TBP has a large molecular size relative to the molecular size of silane, TBP requires a longer period of time at the deposition temperature than does silane in order to fully decompose. This is especially the case where, as in the preferred embodiment, the deposition temperature is relatively close to the 550° C. decomposition temperature of TBP. Complete decomposition of TBP results in the active species for doping (i.e., $P_2$, $PH_2$, or $PH$, individually or in combination, depending upon the deposition conditions) together with volatile hydrocarbon and other compounds. However, if TBP molecules are not fully decomposed when introduced into the LPCVD chamber, non-volatile phosphorous compounds may deposit upon the wafer surface. This causes depressed deposition rates, as well as poor uniformity of the thickness of the deposited film due to poisoning of the surface and site competition, similarly as discussed above. Accordingly, it is preferred that the TBP be fully decomposed at the time the wafer surface is exposed thereto, in order to maintain good deposition rates and uniformity.

Figure 3:
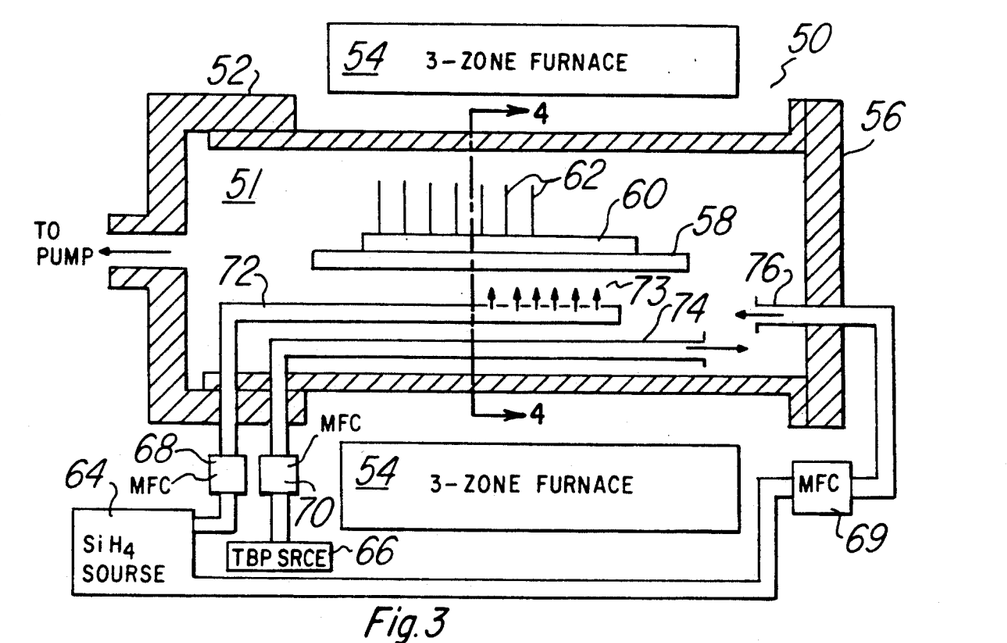
FIGS. 3 and 4 are cross-sectional schematic views of a CVD reactor according to the invention.
Figure 4:
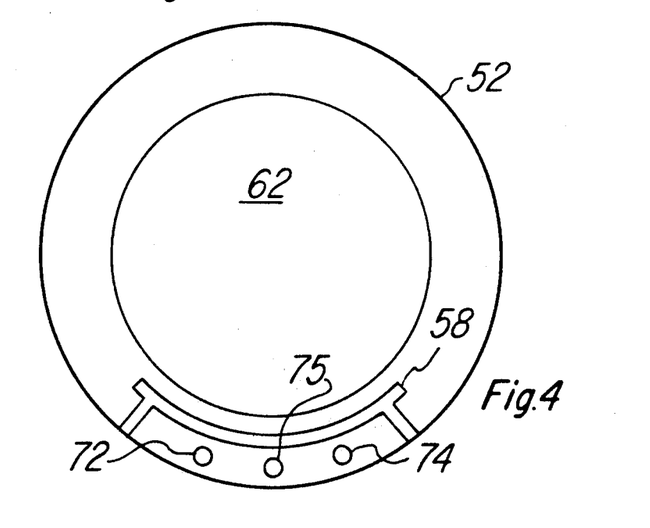

Referring now to FIGS. 3 and 4, a preferred embodiment of a batch LPCVD reactor 50 according to the invention, and which addresses the problem of incomplete decomposition of the dopant source, is schematically illustrated. Reactor 50, as in conventional LPCVD reactors, has a chamber 51 defined by walls 52, and surrounded by a three-zone furnace 54. One end of chamber 51 is closed off by door 56 through which a boat 60 of wafers 62 are loaded into reactor 50 onto support 58. Opposite from door 56, chamber 51 has an orifice through which the chamber is evacuated by a pump (not shown), as is conventional for LPCVD reactors.

In reactor 50 according to this embodiment of the invention, a silane source 64 and a dopant source 66 (in this example providing TBP) provide their respective gases through mass flow controllers (MFCs) 68 and 70, respectively. The output of MFC 68, for silane, is connected to injector tube 72 in the chamber of reactor 50. Injector tube 72 has its injector orifices 73 distributed along its length, to provide uniform flow of silane into chamber 51. A second MFC 69 is connected to silane source 64, and provides a flow of silane through injector tube 76 through door 56. The multiple MFCs 68 and 69 allow for independent control of the flow of silane through injector tubes 72 and 76, respectively, so that the uniformity of deposition can be well controlled for reactor 50. In addition, the position of boat 60 with wafers 62 thereupon can be selected to optimize uniformity of deposition. According to this embodiment of the invention, not only is the silane introduced more uniformly into chamber 51 by the distributed orifices 73 in injector tube 72, but control of the flow by MFCs 68 and 69, and the position of boat 60, provide controllability of the deposition reaction. These advantages allow the wafer spacing 62 to be reduced, improving the throughput for the deposition process.

In addition, MFC 70 for TBP source 66 has its output connected to injector tube 74. Injector tube 74 is shown as disposed below injector tube 72 in FIG. 3 for clarity; as shown in FIG. 4, injector tubes 72 and 74 are preferably disposed under support 58 at approximately the same distance from wafers 62. Thermocouple 75 is provided within chamber 51 for monitoring and control of three-zone furnace 54. Referring again to FIG. 3, injector tube 74 travels the length of chamber 51, and has its injector orifice at the door end of chamber 51, away from the pump end near which the dopant is introduced. As described above, the low temperature at which deposition preferably takes place allows a reduced ratio of of dopant concentration to silane.

Accordingly, the flow of TBP through injector tube 74 can be relatively low, for example on the order of 1 sccm. The flow of silane into chamber 51 is relatively high in this embodiment, for example on the order of 250 sccm. This high silane flow provides a relatively low TBP to silane ratio during deposition, which improves the uniformity of the deposition as described hereinabove, while still allowing the TBP flow rate to be in a controllable range.

The provision of injector tube 74 according to this embodiment of the invention provides advantages over conventional LPCVD reactors, where dopant is mixed with silane gas prior to introduction into the chamber. Due to the low flow of TBP through the length of injector tube 74, the residence time of the TBP in injector tube 74 is quite long; in this example, the transit time of TBP through injector tube 74 is on the order of four seconds. This allows the TBP to be fully heated to the deposition temperature prior to its introduction into the chamber, and allows substantially complete decomposition of TBP by the time its constituents reach the surfaces of wafers 62. As mentioned above, the full decomposition of TBP prior to its introduction into chamber 51 minimizes local deposition of non-volatile constituents of TBP on wafers 62. Accordingly, the uniformity of deposition of in-situ doped silicon is improved, as indicated in Table 1.

It should be noted that the dopant source gas, in this case TBP, can be alternatively heated prior to its entrance into reactor 50. If the dopant gas is heated prior to its entrance into the reactor 50, it is preferable that the gas be heated prior to reaching MFC 70, as the gas is at a higher pressure thereat and its heating will therefore be more efficient than if it were heated after MFC 70 and prior to reaching reactor 50.

As a result of the above-described method, film 22 of silicon, doped with phosphorous, is deposited over the surface of the wafer as shown in FIG. 1b. Due to the relatively low temperature of deposition (e.g., below 600° C., preferably at 560° C.) according to this embodiment, silicon film 22 is in substantially an amorphous state. It has been observed that the patterning and etching of amorphous silicon, especially for applications where feature sizes are on the order of less than one micron, is improved over the patterning and etching of polycrystalline silicon, as the edges of the patterned and etched film are more sharply defined. According to this embodiment, conventional photolithography and silicon etch are performed prior to anneal of doped silicon film 22, resulting in the structure of FIG. 1c. In the example of FIG. 1c, doped silicon film 22 is serving as a buried contact to diffused region 16 via silicide film 18, extending over field oxide 22 to contact another diffused region, or to be contacted by an overlying metallization layer after conventional deposition of an insulating layer and contact formation.

After the patterning and etching of doped silicon film 22, an anneal is preferably performed in order to activate the dopant therein. Various anneal conditions are suitable for such an anneal which will not adversely affect the junctions of diffused regions 16, either from excessive silicide reaction or from additional diffusion of the dopant therein. Examples of such anneals include a sixty minute furnace anneal at a temperature from about 700° C. to 800° C., or a thirty minute furnace anneal at a temperature of 900° C. Alternatively, the anneal may be done in a rapid thermal anneal apparatus, such as Peak RTA machine, for five minutes at 800° C. to 900° C., or for one minute at 1000° C. It should be noted that a separate anneal of the deposited silicon film is not necessary, as such process steps as the anneal for activation and diffusion of the dopant implanted for source/drain (if not previously performed), and the densification of overlying insulator films such as PSG or BPSG, will be sufficient to activate the dopant in the in-situ doped deposited silicon film formed according to this embodiment of the invention. Accordingly, the anneal of silicon film 22 can be done at lower temperatures and shorter times that conventional POCl₃ doped films, or alternatively without a separate anneal step (the anneal of silicon film 22 occurring simultaneously with a subsequent high temperature step). The thermal "budget" for the overall fabrication process is thus conserved by the deposition method according to this embodiment of the invention, not only due to the low temperature deposition, but also due to the availability of low temperature (or combined) anneal of the film.

Results of the various anneal conditions on the resistivity of in-situ doped silicon films at 560° C., according to the above-described method in the apparatus of FIGS. 3 and 4, are shown in Table 2 for different ratios of TBP to silane concentrations during deposition.

TABLE 2

|  | Resistivity (mOhm-cm) | |
|---|---|---|
| Anneal conditions | TBP/SiH₄ = 0.003 | TBP/SiH₄ = 0.006 |
| Furnace |  |  |
| 700° C./60 min. | 2.31 | 1.72 |
| 800° C./60 min. | 1.50 | 1.18 |
| 900° C./30 min. | 1.08 | 0.86 |
| RTA |  |  |
| 800° C./5 min. | 1.72 | 1.48 |
| 900° C./5 min. | 1.21 | 1.03 |
| 1000° C./1 min. | 0.97 | 0.71 |

As is evident from Table 2, reasonable resistivity values can be obtained using the lower TBP to silane ratio of 0.003. Lower resistivity values can be obtained with a higher ratio of TBP to silane, although the uniformity of the deposited film thickness will likely be reduced, as shown in Table 1.

It should be noted that, besides activation of the in-situ dopant in the deposited silicon film, the anneal will also change the silicon film from amorphous (as deposited) to polycrystalline.

Figure 5A:
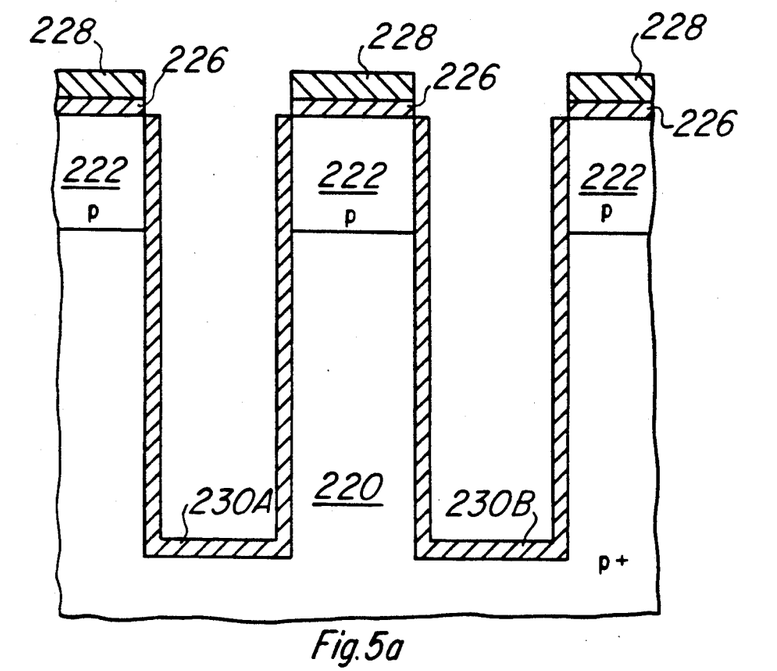
FIGS. 5a through 5i are cross-sectional diagrams of a partially fabricated wafer into which DRAM cells are fabricated using the method of the invention.

Referring now to FIG. 5a, a second structure into which the in-situ doped silicon of the invention can be advantageously utilized, will now be described in detail. This structure is more fully described in the above-referenced U.S. Pat. No. 4,830,978, incorporated herein by reference. This structure is a memory cell for a dynamic random access memory (dRAM), where both the storage capacitor and the pass transistor for the memory cell are formed within a trench etched into the substrate. Substrate 220 in this embodiment is p+ type single crystal silicon, into which trenches have been etched using silicon dioxide 226 and silicon nitride 228 as hardmask material. Along the sides of the trench, silicon dioxide 230A and 230B are formed by thermal oxidation. Regions 222 are p-type regions into which the pass transistors will be formed, preferably formed by epitaxy onto substrate 220 prior to the etching of the trenches.

Figure 5B:
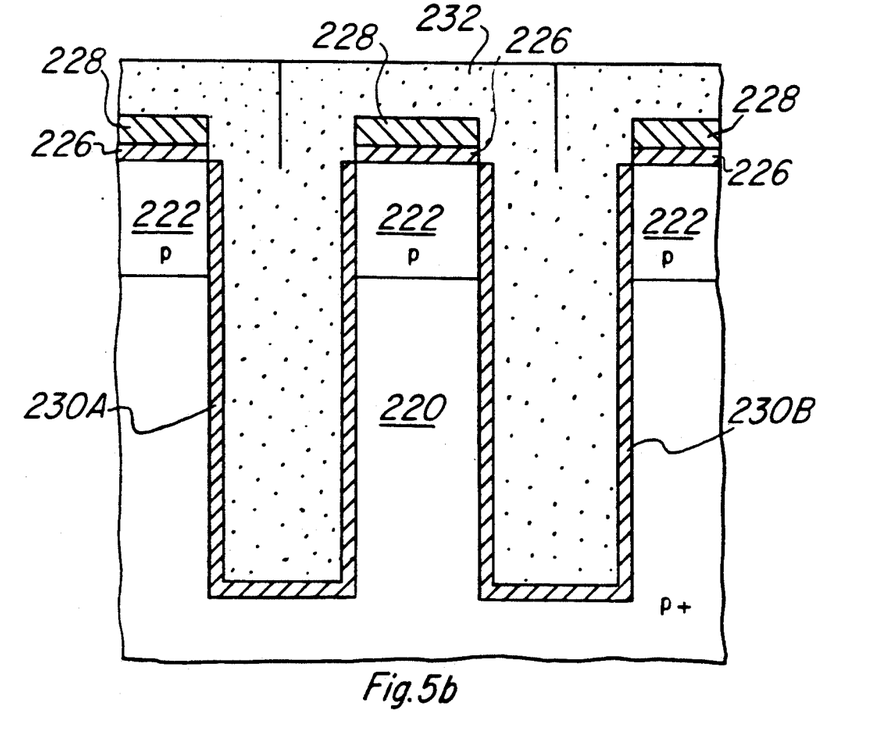

Referring now to FIG. 5b, a silicon layer 232 is shown deposited into the trenches. Silicon layer 232 is preferably formed according to the method described hereinabove, doped in-situ with deposition using a liquid vapor dopant source such as TBP. As discussed above, this method is particularly advantageous in the application of trench dRAM cells such as shown in FIG. 5b, as the thickness uniformity and the conformality of the deposited film 232 is crucial to the successful formation of the silicon layer 232. It should further be noted that trench depths for high density dRAMs such as 16 Mbit dRAMs may exceed 10 microns, with a width on the order of 0.8 micron across at the top.

Figure 5C:
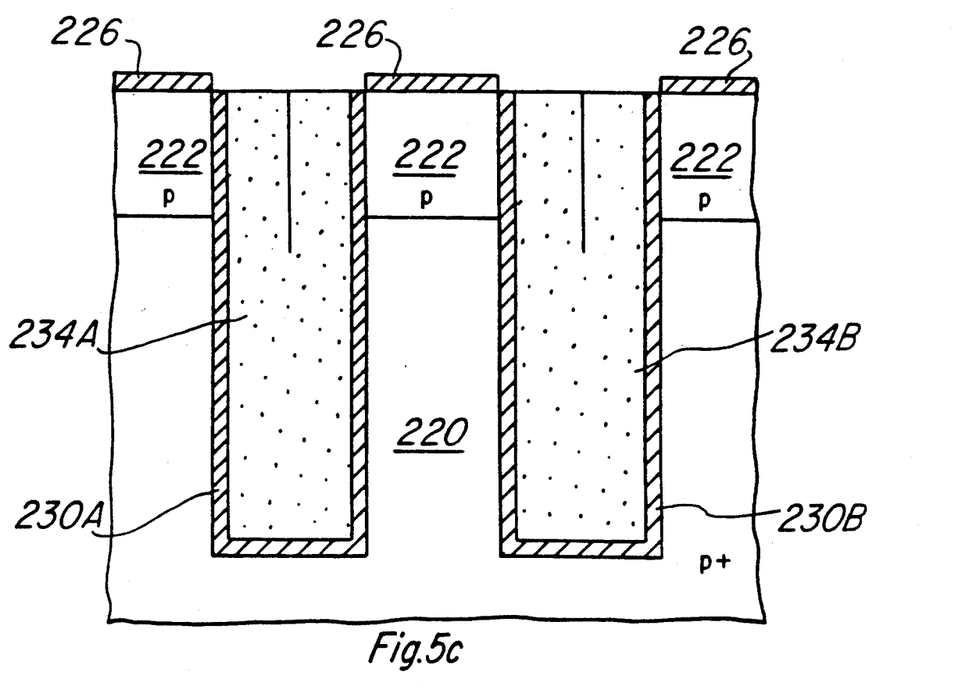

For such high aspect ratio trenches, the conformality and uniformity of the deposited film is especially important, as non-conformal deposition can cause the deposited silicon film to seal the top of the trench prior to such time as the trench is filled with silicon. If this occurs, a seam or void will be present, within silicon film 232 and within the trench. For this application, silicon film 232 will be etched back first to the level of the top of regions 222, as shown in FIG. 5c, prior to the application of a masking layer of silicon nitride 233, and photoresist 235. Silicon plugs 234A and 234B remain within the trenches of the device.

Figure 6:
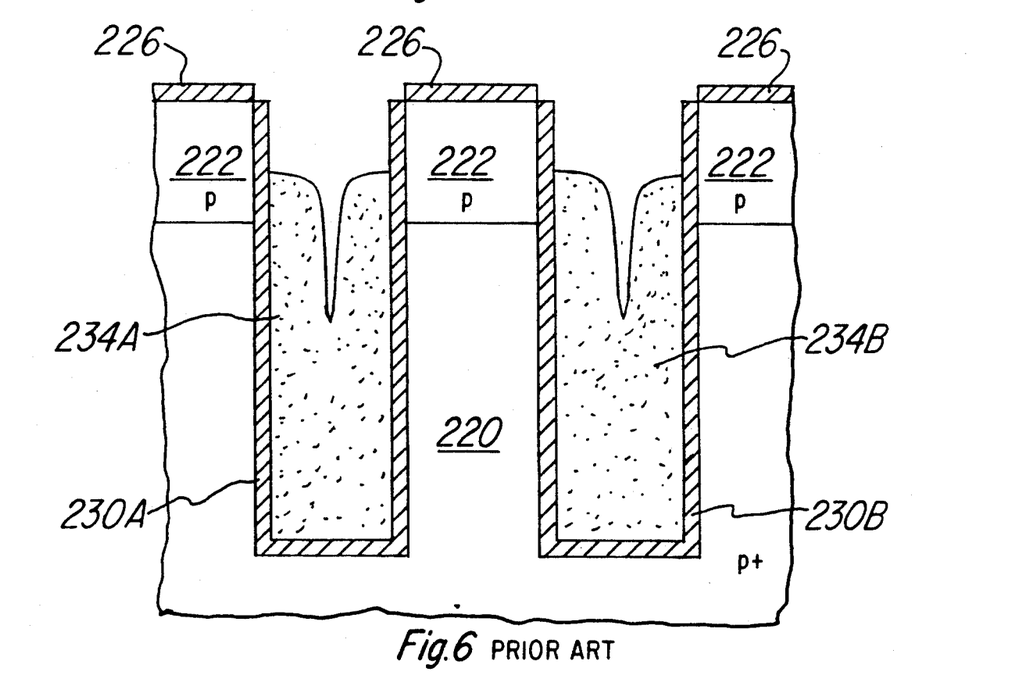
FIG. 6 is a cross-sectional diagram of the partially fabricated wafer of FIG. 5c, showing a problem with prior art deposition methods.

It should be noted that if voids are present in silicon layer 232 within the trench, silicon plugs 234A and 234B would not have relatively flat tops after this first etchback as shown in FIG. 5c, but would instead have v-shaped grooves therein as shown in FIG. 6, such grooves extending well into the interior of the trench. As will be apparent from the remainder of the description of the fabrication of this dRAM cell, the presence of such grooves in silicon plugs 234 would present significant problems in reliably forming the dRAM cells, especially in high density such as 16 Mbit dRAM devices. It has been observed that the deposition of silicon film 232 according to the above-described method results in minimal voids for trench plugs, which in turn allows the etchback of silicon layer 232 within a trench to have a uniform upper surface as shown in FIG. 5c.

Figure 5D:
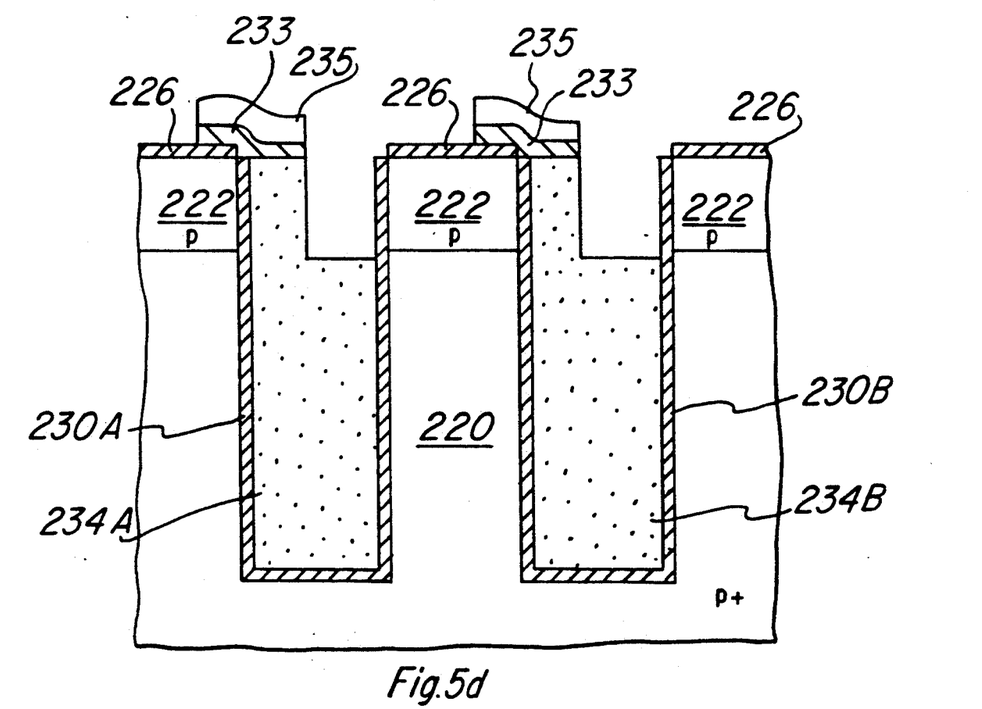
Figure 5E:
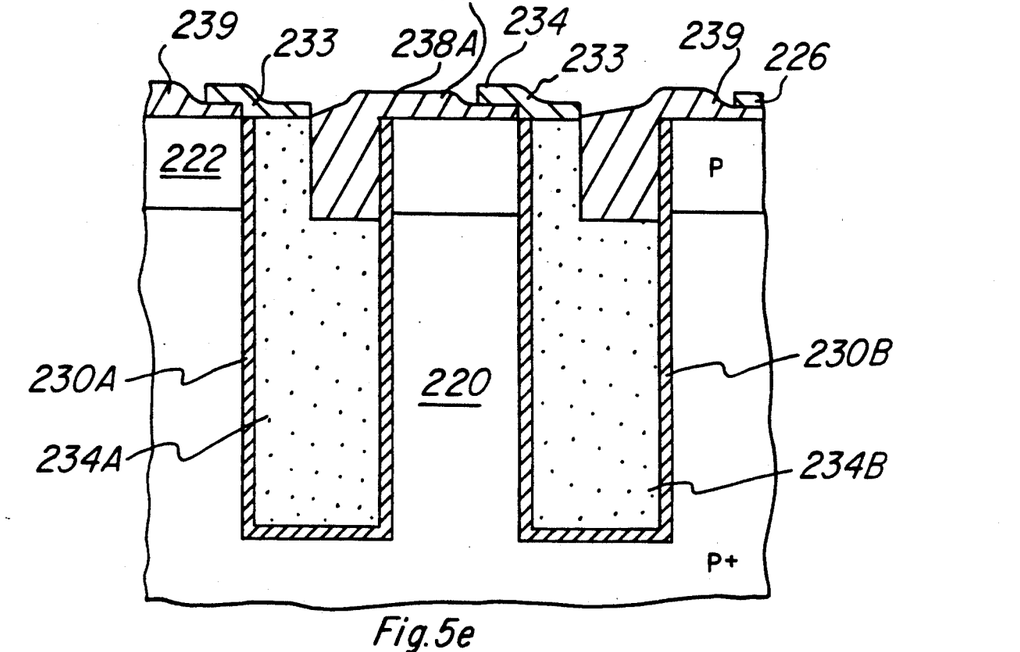
Figure 5F:
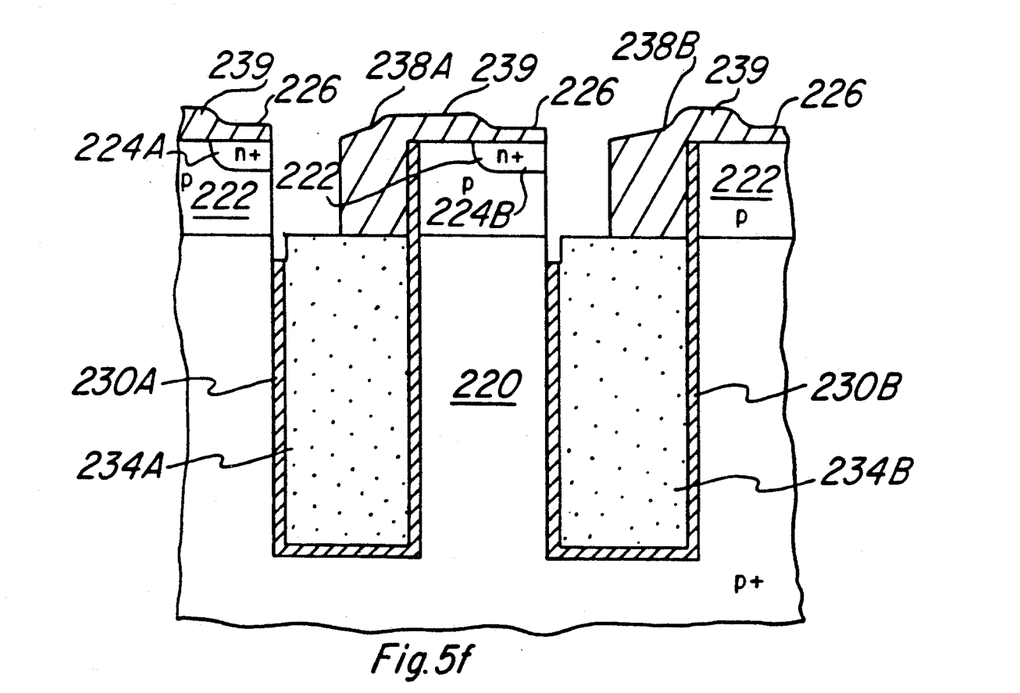

After the mask of nitride 233 and photoresist 235 is in place, silicon plugs 234A and 234B are etched back into the trench to a depth of approximately 1.0 to 1.5 microns by way of an anisotropic silicon etch, resulting in the structure of FIG. 5d. Subsequent to this etchback step, 238A, 238B and 239 are formed by way of deposition, thermal oxidation (with nitride layer 233 as an oxidation mask), or both, as shown in FIG. 5e. In addition, ion implantation of n+ regions 224A and 224B are done with silicon dioxide layer 239 as a mask for the implantation, followed by an anneal to activate the dopant thereof, which also will activate the dopant in silicon plugs 234A and 234B. Plugs 234 are then etched back again, as shown in FIG. 5f, and silicon dioxide 230A and 230B is removed from the exposed sides of the trenches thereat. As in the case described above, non-conformal deposition of silicon layer 232 would also adversely affect the result of this etchback; deposition of silicon layer 232 according to the above-described method has been observed to also produce good etchback results at this stage.

Figure 5G:
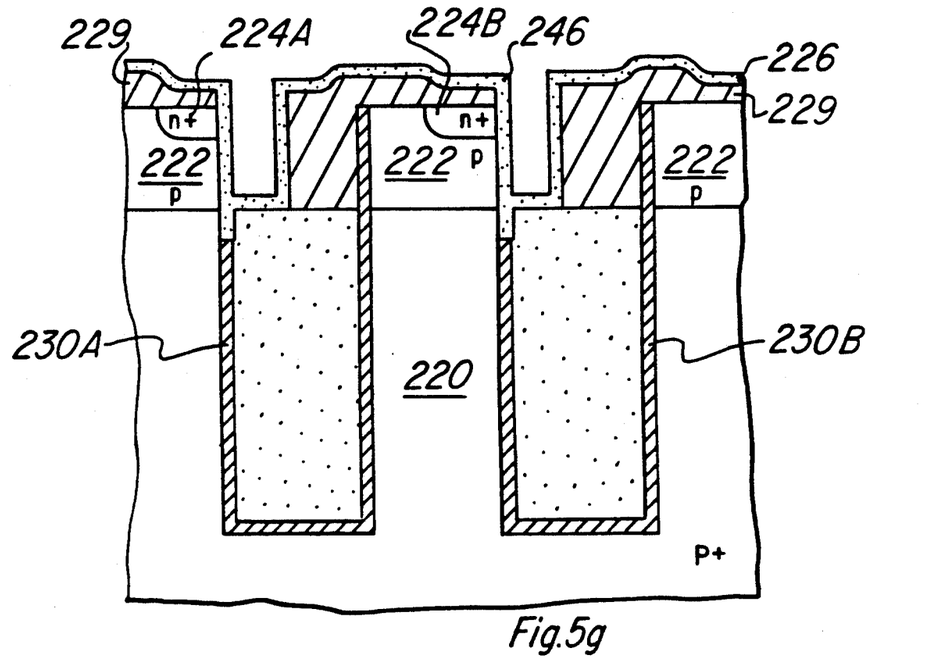
Figure 5H:
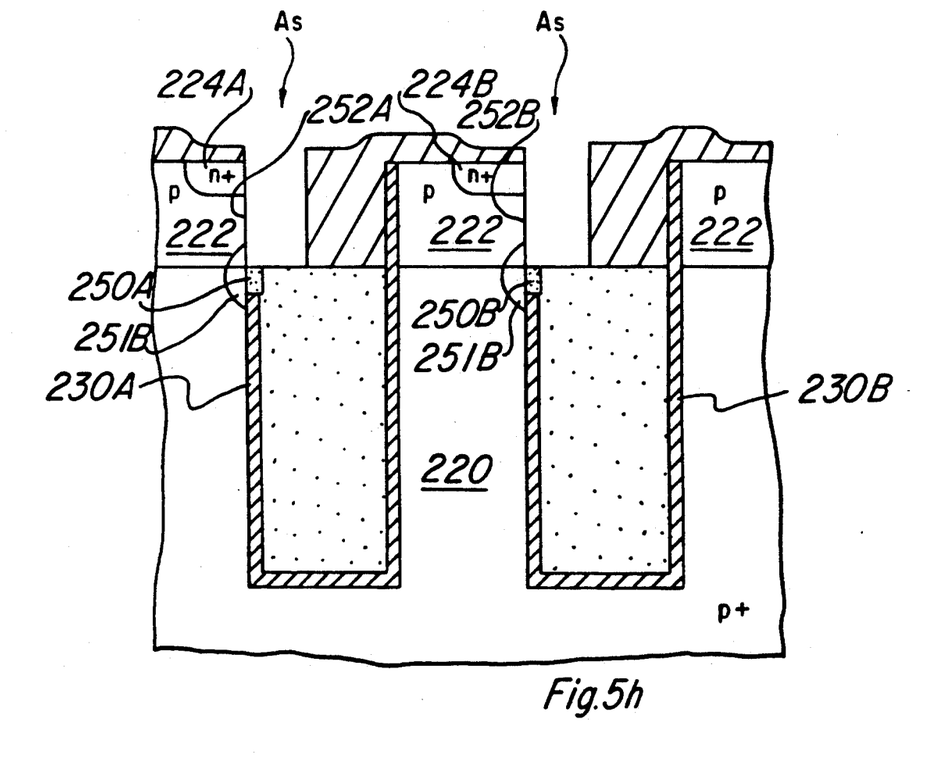

A second deposition of silicon is then performed, also according to the above-described method, to form silicon layer 246 of approximately 20 nm in thickness over the structure and in contact with the exposed sides of the trench, as illustrated in FIG. 5g. An isotropic etch of silicon layer 246 is then performed, removing the entire layer except for portions 250A and 250B in the "notch" where silicon dioxide layer 230A and 230B was removed, as shown in FIG. 5h. Anneal of this structure causes dopant from portions 250A and 250B to out-diffuse into the boundary between p-type region 222 and p+ substrate 222, which serves as a source/drain for the eventual pass transistor, connected to polysilicon plugs 234A and 234B through portions 250A and 250B.

The memory cell is completed by thermal oxidation of the structure of FIG. 5h to insulate the sides of the trenches as well as the tops of plugs 234A and 234B. Due to the preferential oxidation of n+ regions 224A and 224B, and of polysilicon plugs 234A and 234B, oxide layer 248A and 248B is thicker thereover relative to its thickness over p region 222. Following the thermal oxidation, another doped silicon layer 254 is deposited over the structure, doped in-situ with its deposition according to the method described hereinabove. Prior to its anneal, layer 254 is patterned and etched to form separate word lines for each row, with an anneal as described hereinabove performed preferably after patterning and etching to activate the dopant and to cause silicon layer 254 to change from an amorphous state (as deposited) to polycrystalline. Silicon layer 254 thus serves as the gate for the vertical pass transistor, where n+ region 224 serves as one source/drain and region 251 serves as the other, with connection to plug 234 (for each of the cells of FIG. 5i).

Figure 5I:
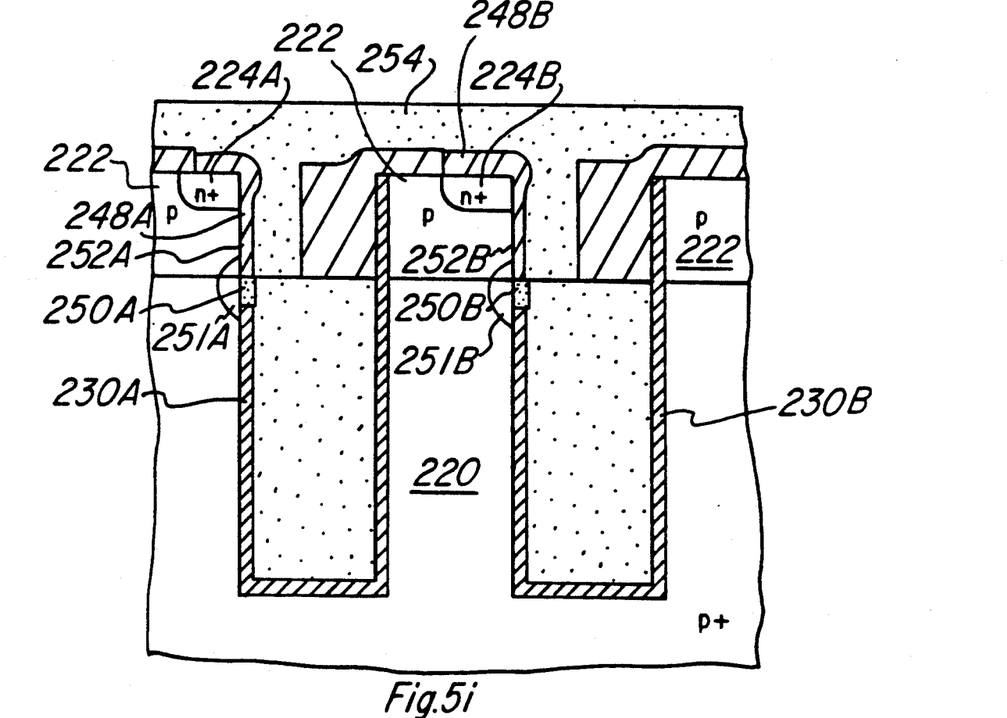

As in the case of the prior depositions, the improved uniformity of deposition and the conformality of the deposited film provides reliable and effective filling of the pass gate portion of each of the trench dRAM cells shown in FIG. 5i. In addition, the deposition of silicon layer 232 at process conditions of 560° C. and 250 mTorr, with the TBP to silane ratio of 0.003, has resulted in plugs 234A having resistivities of less than 1.0 mOhm-cm, and step coverage (ratio of thickness on trench sides versus top surface) of 97%. For purposes of a dRAM storage plate, a resistivity value of 1.0 mOhm-cm provides, in this application, a $C_{min}/C_{max}$ ratio of 90%. Structures built according to the above process have been observed to not suffer degradation of gate dielectric integrity, and to not have stress induced defects present in substrate 220.

Subsequent to the completion of the method described hereinabove, insulating layers and metal interconnect layers will be provided as is conventionally known, in order to provide connection to the elements of the structures of FIG. 1c and of FIG. 5i, in such a manner as to form a complete integrated circuit. Individual circuits are then separated from portions of the wafer, and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985, assigned to Texas Instruments Incorporated, and incorporated herein by this reference.

As described above, the instant invention provides for high conductivity silicon films, deposited at good deposition rates, and with improved uniformity of thickness. In addition, the conformality of the deposited film allows its use for difficult applications such as the formation of polysilicon plugs in high aspect ratio trenches, with reduced void and seam formation to allow good etchback characteristics. The invention also provides a method of depositing a silicon film which is compatible with modern fabrication processes, such as those which have shallow junction depths and silicide-clad junctions, in such a way that later depositions may be done according to this method.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A method for the deposition of a doped a silicon film on a surface, comprising the steps of:
   a) placing said substrate in a reaction chamber of a reactor;
   b) heating said substrate to a temperature between about 550 degrees C. and 600 degrees C.;
   c) introducing silane into said reaction chamber and into contact with said substrate;
   d) separately preheating a vaporous dopant source above the temperature at which it begins to decompose; and
   e) then separately introducing the preheated dopant source into said reaction chamber, whereby the dopant mixes with the silane and passes into contact with said substrate, and a doped silicon film is deposited on the substrate.

2. A method for the deposition of a doped a silicon film on a surface, comprising the steps of:
   a) placing said substrate in a reaction chamber of a reactor;
   b) heating said reaction chamber and substrate to a temperature between about 550 degrees C. and 600 degrees C.;
   c) introducing silane into said reaction chamber and in contact with said substrate;
   d) separately passing a vaporous dopant source through a tube located within said reaction chamber, at a rate slow enough to cause preheating of said dopant source above the temperature at which it begins to decompose; and
   e) then passing said preheated dopant source into said reaction chamber and into contact with said substrate, whereby a doped silicon film is deposited on the substrate.

3. A method as in claim 1 wherein the preheating of said dopant source is continued for a time sufficient to cause substantially complete decomposition thereof prior to contact with said substrate.

4. A method as in claim 2 further including the step of controlling the flow rate of said dopant source within said tube to ensure that said source is substantially fully decomposed prior to the step of passing the source into the reaction chamber and into contact with the substrate.

5. A method as in claim 1 wherein said dopant source is tertiary butyl phosphine.

6. A method as in claim 1 wherein the ratio of dopant source to silane is less than 1%.

7. A method as in claim 2 wherein said dopant source is tertiary butyl phosphine.

8. A method as in claim 2 wherein the ratio of dopant source to silane is less than 1%.

* * * * *